United States Patent [19]

Westcott

[11] 4,404,519

[45] Sep. 13, 1983

[54] TESTING EMBEDDED ARRAYS IN LARGE SCALE INTEGRATED CIRCUITS

[75] Inventor: Douglas W. Westcott, Wappingers Falls, N.Y.

[73] Assignee: International Business Machine Company, Armonk, N.Y.

[21] Appl. No.: 214,923

[22] Filed: Dec. 10, 1980

[51] Int. Cl.³ .................................................. G01R 15/12
[52] U.S. Cl. ................................ 324/73 R; 324/73 AT
[58] Field of Search .............................. 371/20, 21, 25; 324/73 R, 73 AT, 73 PC; 364/551, 580

[56] References Cited

U.S. PATENT DOCUMENTS 3,961,252  6/1976  Eichelberger ................. 324/73 AT
3,961,254  6/1976  Cavaliere ....................... 324/73 AT Primary Examiner—Michael J. Tokar
Attorney, Agent, or Firm—Sughrue, Mion, Zinn, Macpeak and Seas

[57] ABSTRACT

An integrated circuit chip having an embedded array which is not directly accessible from the primary input/output chip pins is manufactured with additional test circuitry directly on the chip, such that the performance of the array may be physically tested from the input/output pins by an external chip tester while the array remains embedded. Because of the added test circuitry, tests are not limited to the original chip architecture, and a variety of array tests may be made by an external tester without redesigning the chip architecture.

10 Claims, 6 Drawing Figures

TESTING EMBEDDED ARRAYS IN LARGE SCALE INTEGRATED CIRCUITS

BACKGROUND OF THE INVENTION

1. Field of the Invention

This invention relates to the testing of memory arrays and, more particularly, to an apparatus and method for self-testing of a memory array embedded in a large scale integrated (LSI) circuit of the type utilized in digital computers and the like.

2. Description of the Prior Art

Methods and apparatus for testing memory arrays and, in particular, embedded arrays are disclosed in the following U.S. Patents:

U.S. Pat. No. 3,751,649, issued Aug. 7, 1973, and entitled "Memory System Exerciser".

U.S. Pat. No. 3,781,670, issued Dec. 25, 1973, and entitled "AC Performance Test for Large Scale Integrated Circuit Chips".

U.S. Pat. No. 3,781,683, issued Dec. 25, 1973, and entitled "Test Circuit Configuration for Integrated Semiconductor Circuits and a Test System Containing Said Configuration".

U.S. Pat. No. 3,789,205, issued Jan. 29, 1974, and entitled "Method of Testing Mosfet Planar Boards".

U.S. Pat. No. 3,790,885, issued Feb. 5, 1974, and entitled "Serial Test Patterns for Mosfet Testing".

U.S. Pat. No. 3,849,872, issued Nov. 26, 1974, and entitled "Contacting Integrated Circuit Chip Terminal Through the Wafer Kerf".

U.S. Pat. No. 3,924,144, issued Dec. 2, 1975, and entitled "Method for Testing Logic Chips and Logic Chips Adapted Therefor".

U.S. Pat. No. 3,961,251, issued June 1, 1976, and entitled "Testing Embedded Arrays".

U.S. Pat. No. 3,961,252, issued June 1, 1976, and entitled "Testing Embedded Arrays".

U.S. Pat. No. 3,961,254, issued June 1, 1976, and entitled "Testing Embedded Arrays".

U.S. Pat. No. 4,074,851, issued Feb. 21, 1978, and entitled "Method of Level Sensitive Testing a Functional Logic System with Embedded Array".

Thus, even though the problem of testing embedded arrays has been addressed in the past, none of the prior art solutions permits performance testing, disturb testing and diagnostic testing, while at the same time permitting a wide variety of test patterns to be applied to the array while the array is still embedded.

SUMMARY OF THE INVENTION

In accordance with the present invention, there is provided a method and apparatus for the complete testing of a memory array which is buried in a large scale integrated circuit, i.e., which is inaccessible directly from the primary input/output terminals of the integrated circuit chip because of other circuit elements electrically connected between the array and the terminals. As compared to the prior art, relatively few components must be added to the chip for the purpose of testing the buried array.

A specific feature of this invention is the use of an address gate which permits a test pattern to be rippled along individual word and bit address lines of the buried array.

After a test pattern is written in the array, the stored pattern is read out and compared with the applied test pattern to provide an error signal if the proper comparison does not oocur.

For a better understanding of the present invention, together with other and further advantages and features thereof, reference is made to the following description taken in connection with the accompanying drawing. The scope of the invention is pointed out in the appended claims.

DESCRIPTION OF THE PREFERRED EMBODIMENTS

Figure 1:
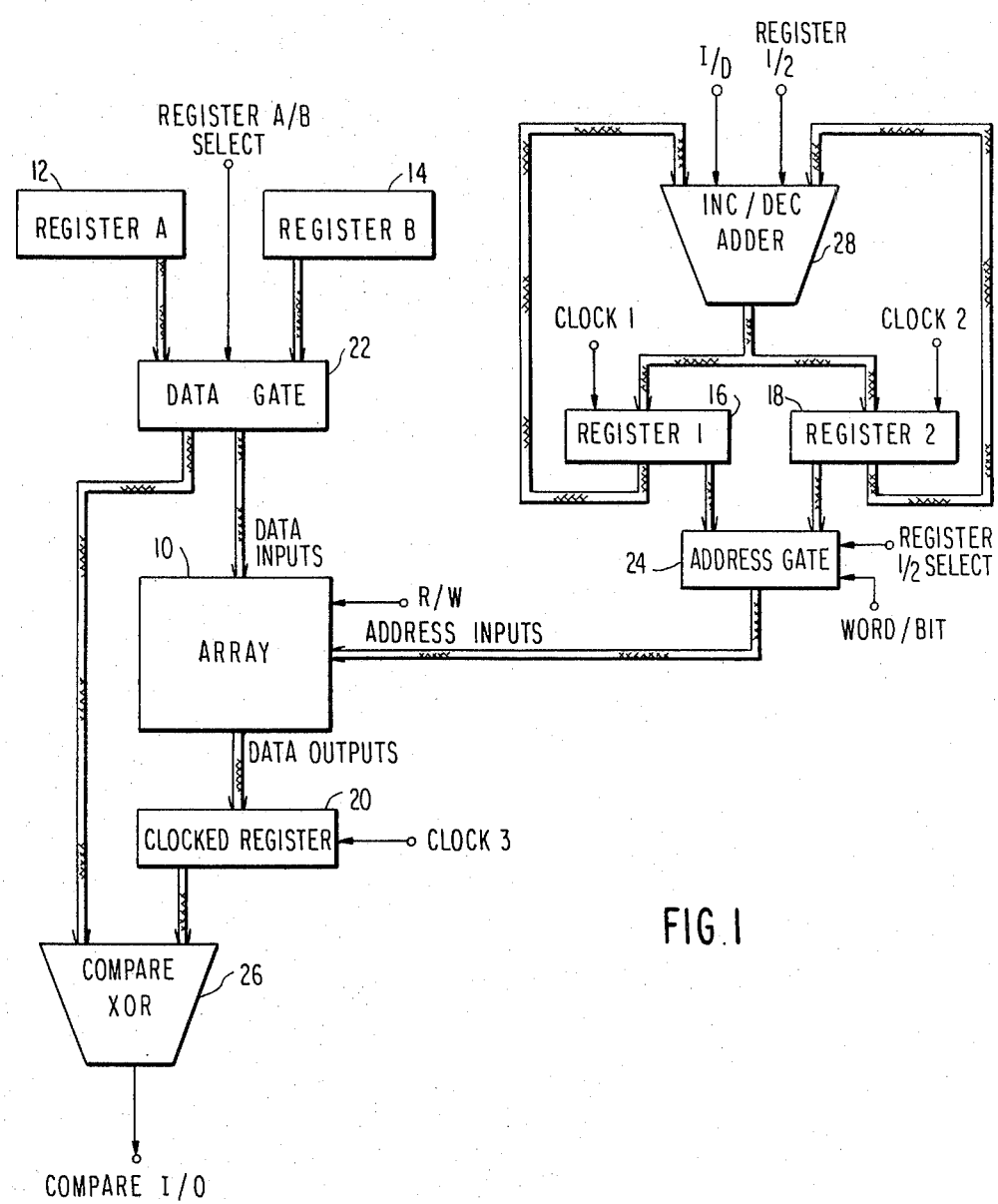
FIG. 1 is a schematic block diagram illustrating the integrated circuit components and the test signals used to test a buried memory array in accordance with the present invention.

The testing of embedded arrays is becoming more and more difficult as the density of elements in large scale integrated circuits increases. The method and apparatus of this invention allows buried arrays to be tested at chip level, just as if they were not buried.

In brief, the invention consists of additional logic in the chip as well as additional dedicated input/output (I/O) pins on the chip. Where possible, the normal system logic already existing on a particular chip is used instead of additional logic added specifically for testing. All latches in the system are assumed to be pre-conditionable to any state from the chip I/O pins. This result can be accomplished by using registers consisting of level sensitive scan design (LSSD) polarity hold latches or by various other schemes.

In one embodiment test patterns are applied to the array by gating the patterns from either of two data registers under the control of an I/O pin which selects the particular register to be gated to the array. Since both the data registers can be preconditioned to any desired state, and since the selection of the mix of test patterns from the two registers can be made from the chip I/O pin, any desired test pattern can be used to test the buried array.

An increment/decrement address counter means may take the form of two different address registers which store array addresses for testing the array. An address gate controllable from a chip I/O pin selects which register is to be gated to the array addresses. A second I/O pin determines which address bits are gated to the array word addresses and which are gated to the bit address, such that incrementing the selected address register ripples either the word address first or the bit address first. The address registers are updated by an increment/decrement adder which is controlled by two I/O pins, one for selecting either "increment" or "decrement", and one for selecting either of the registers. Clock signals applied to two separate I/O pins control loading of the results of the adder into the selected register. Therefore, this invention allows increment, decrement, ripple bit, and home/alternate address generation to be achieved, thus covering the majority of the addressing modes presently used in testing arrays.

The test patterns written into the array are then read by being clocked into an output register under the control of a clock signal applied to another I/O pin. The read/write (R/W) operation is controlled by an R/W signal applied to another chip I/O pin.

The data in the output register is then compared with the test pattern initially applied to the array. The resulting comparison signal is indicative of the performance of the embedded or buried memory array in the integrated circuit chip.

Thus, this invention provides a minimum of additional circuitry to the logic in a large scale integrated circuit chip, such as microprocessor, whereby disturb testing, performance testing and diagnostic testing may all be performed on a memory array embedded or buried in the chip. Furthermore, the invention allows tests performed on the array to be defined by the external chip tester, as opposed to being limited to tests built into the chip at the time the chip is designed. Thus, tests can be added or deleted after the chip has been manufactured.

FIG. 1 is a schematic block diagram of a preferred embodiment of a chip architecture required to accomplish such testing on a memory array 10 emnbedded or buried in a large scale integrated circuit chip. Only those elements required for an understanding of the invention are illustrated, as a typical LSI chip, such as a microprocessor, would contain many more circuit elements than those shown in FIG. 1.

This test architecture consists of five registers: Register A designated by reference numeral 12, Register B designated by reference numeral 14, Register 1 designated by reference numeral 16, Register 2 designated by reference numeral 18, a Clocked Register 20, a Register Select Gate 22, an Address Gate 24, an Exclusive OR (XOR) Compare tree 26, and an Adder 28. In addition, there are the following chip input/output (I/O) pins which are identified as follows by the signals applied to these pins: Register Select, Read/Write (R/W), Clock 1, Clock 2, Clock 3, Increment/Decrement, Register 1/Register 2, Register 1/2 Select, Word/Bit, and Compare I/O. The function and design of each of these components and control signals will now be explained in detail.

Figure 2:
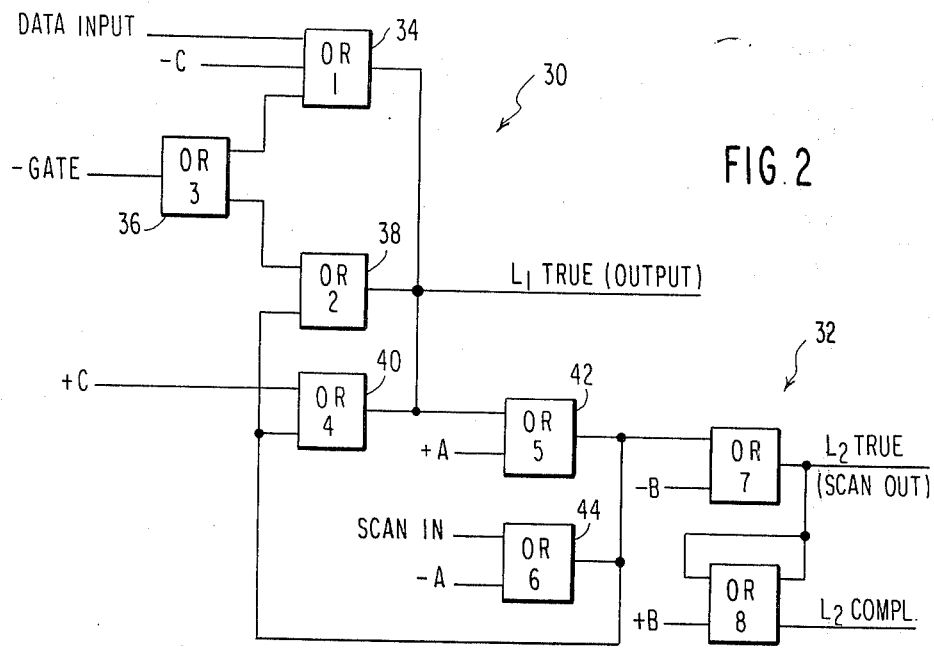
FIG. 2 is a logic diagram of one of the level sensitive scan design polarity hold latches of which all of the registers in FIG. 1 are made.

First, all of the registers are made of level sensitive scan design polarity hold (LSSD) latches. Such LSSD latches are described, for example, in U.S. Pat. No. 3,961,254 and 4,074,851. A typical logic diagram of such a latch is illustrated in FIG. 2. This LSSD latch actually consists of two latches 30 and 32, both of which are polarity hold latches. The first latch 30 is composed of logic boxes 34, 36, 38, 40, 42 and 44. This latch can be loaded either by pulsing the C Clock which loads the latch from the Data Input or by pulsing the A Clock which loads the latch from the Scan In. The second level of the LSSD latch operates by pulsing the B Clock which loads the second latch 32 with the contents of the first latch 30.

In normal operation of the system on the chip, i.e., in other than a test mode, only the C Clock and Data In lines are used, with the output being taken at the output $L_1$ of the first latch 30. The A Clock, B Clock, and Scan In are used only to load or initialize the LSSD latch for test purposes. In a register consisting of several of these LSSD latches, the Scan Out $L_2$ of the second latch 32 is fed into the Scan In of another LSSD latch, such that in the test initialization mode all of the LSSD latches become part of a long shift register, thus allowing the initialization of the test sequence to be entered into the latches by feeding the required starting values of the system to the Scan In line, and then shifting the values through the latch string using the A and B Clocks. This technique allows all the registers to be loaded to any desired initial value by the tester which exercises direct control over the A Clock, B Clock, and Scan In signals.

Thus, Registers A and B are composed of the LSSD latches described above. The purpose of these registers is to provide data in the form of test patterns for the array 10 under test. In other than the test mode, these latches may be part of the architecture of the system on the chip. These registers have as many bits as there are in the embedded array 10; i.e., if the array is 9 bits wide, then there are 9 bit positions in each of Register A and Register B.

Register 1 and Register 2 are also composed of these LSSD latches. The purpose of these registers is to provide the address for the array 10 under test. Again, in normal operations these registers can be part of the machine architecture on the chip. These registers have as many bits as there are address lines in the embedded array 10. For example, if the array 10 has seven address lines, then these registers are each seven bits wide.

The Clocked Register 20 is also composed of LSSD latches. The purpose of Register 20 is to serve as a receiver for the outputs of the array 10. In normal machine operation, i.e., in other than a test mode, this register also can be part of the normal chip architecture. Again, this register has as many bits as the embedded array has outputs; for example, if the array is nine bits wide, the Clocked Register would also be nine bits wide.

The Register Select Gate 22 is composed of conventional logic which selects data from either Register A or Register B and places it on the Data Inputs of the embedded array 10. The Register Select I/O pin determines whether the contents of Register A or Register B are to be gated to the Data Inputs of the array 10. Again, gate 22 is as wide as Registers A and B and the Data Inputs of the array.

Figure 3:
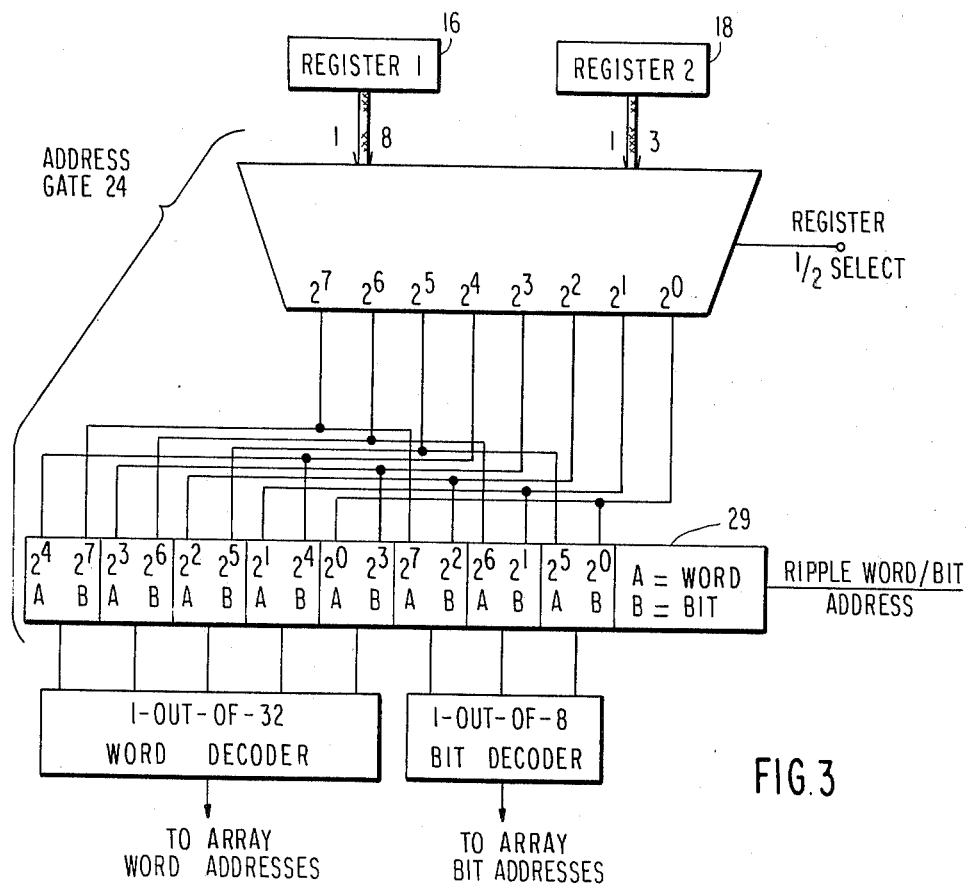
FIGS. 3, 4, 5 and 6 are more detailed block diagrams of the address gate illustrated in FIG. 1.

The Address Gate 24 is composed of logic which serves two purposes, and a more detailed logic diagram of this gate is shown in FIG. 3. The first function of Address Gate 24 is to select either Register 1 or Register 2 as the source of the address to be connected to the Address Inputs of the embedded array 10. The I/O pin Select Register 1/2 serves as the control for this function.

The second function is that of a multiplexer to change the weight of the address bits as they come from Registers 1 and 2 such that physical testing of the array 10 can be accomplished. In most arrays, the array is physically laid out in an X-Y coincident current addressing arrangement, where X is conventionally called the word address and Y the bit address. A simple array of 512 addresses may be laid out physically as 32 word lines and 8 bit lines. Upon the selection of one of the 32 word lines and one of the 8 bit lines, the memory cell located at the point defined by the intersection of the selected word and bit lines is the selected cell that is to be written or read. In testing the array, it is desirable to be able to direct the series of memory operations such that they move back and forth along an array word line or an array bit line.

To accomplish this rippling effect, either the word portion or the bit portion of the addresses is incremented by the address counter means. The addresses which go into the array 10 are designated as either word addresses or bit addresses and are counted up as either rippling the word addresses thus allowing the array to be tested physically back and forth across the bit lines, or rippling the bit addresses to allow physical testing back and forth across the word lines. This result can be achieved by using for each of Registers 1 and 2 a register which has fixed address weights, and by placing on the register output a multiplexer 29 which normally ripples the bit address by applying the fast-moving lower order bits to the bit address lines of the array, but which can be switched or gated to ripple the word address by applying fast-moving low order bits to the word address lines of the array. As shown in FIG. 3, a Ripple Bit address control signal from the internal tester gates the B or Bit weighted register outputs so that the three low ordered bits ($2^0$, $2^1$ and $2^2$) are gated through the array 1-out-of-8 bit decoder 38 to the array bit address lines, while the five higher ordered bits are gated through a 1-out-of-32 bit decoder 40 to the array word address lines. However, a Ripple Word Address control signal effectively gates the five low-ordered bits ($2^0$, $2^1$, $2^2$, $2^3$ and $2^4$) to the array word address lines, while the three high ordered, slow moving bits are gated to the array bit address lines. The following table is an example of this operation for a 32×8 physical array.

| Register 1 | Ripple Bit | Ripple Word |
|---|---|---|
| 0 0 0 0 0 0 0 0 | 0 0 0 0 0 0 0 0 | 0 0 0 0 0 0 0 0 |
| 0 0 0 0 0 0 0 1 | 0 0 0 0 0 0 0 1 | 0 0 0 0 1 0 0 0 |
| 0 0 0 0 0 0 1 0 | 0 0 0 0 0 0 1 0 | 0 0 0 1 0 0 0 0 |
| 0 0 0 0 0 0 1 1 | 0 0 0 0 0 0 1 1 | 0 0 0 1 1 0 0 0 |
| 0 0 0 0 0 1 0 0 | 0 0 0 0 0 1 0 0 | 0 0 1 0 0 0 0 0 |
| 0 0 0 0 0 1 0 1 | 0 0 0 0 0 1 0 1 | 0 0 1 0 1 0 0 0 |
| 0 0 0 0 0 1 1 0 | 0 0 0 0 0 1 1 0 | 0 0 1 1 0 0 0 0 |
| 0 0 0 0 0 1 1 1 | 0 0 0 0 0 1 1 1 | 0 0 1 1 1 0 0 0 |
| 0 0 0 0 1 0 0 0 | 0 0 0 0 1 0 0 0 | 0 1 0 0 0 0 0 0 |
| 0 0 0 0 1 0 0 1 | 0 0 0 0 1 0 0 1 | 0 1 0 0 1 0 0 0 |
| 0 0 0 0 1 0 1 0 | 0 0 0 0 1 0 1 0 | 0 1 0 1 0 0 0 0 |
| 0 0 0 0 1 0 1 1 | 0 0 0 0 1 0 1 1 | 0 1 0 1 1 0 0 0 |
| . | . | . |
| 0 0 0 0 1 1 1 1 | 0 0 0 0 1 1 1 1 | 0 1 1 1 1 0 0 0 |
| 0 0 0 1 0 0 0 0 | 0 0 0 1 0 0 0 0 | 1 0 0 0 0 0 0 0 |
| . | . | . |
| 0 0 0 1 1 1 1 1 | 0 0 0 1 1 1 1 1 | 1 1 1 1 1 0 0 0 |
| 0 0 1 0 0 0 0 0 | 0 0 1 0 0 0 0 0 | 0 0 0 0 0 0 0 1 |

The Exclusive OR (XOR) Compare tree 26 is made of logic which compares the output of the Clocked Register 20 with the expected outputs from either Register A or B (as defined by the Register Select I/O pin). There are as many Exclusive OR circuits in the Compare tree as there are latches in the Clocked Register 20. The outputs of these Exclusive OR circuits are OR'ed together to determine whether any of the bits in the Clocked Register 20 do not match the expected data. In other words, the function of Compare tree 20 is to determine if the data read out of the array 10 matches the data one would expect out of a good array. Thus, whenever one or more of the bits out of the array does not supply the expected data, then the output of the Compare tree 20 indicates a mismatch i.e, a failure of the array.

Adder 28 consists of conventional logic which either increments or decrements (as defined by the Increment/Decrement I/O pin) by 1 the address number in either Register 1 or Register 2 (as determined by the Register 1/Register 2 I/O pin). The output of Adder 28 is then loaded back into the selected register.

The I/O pins which control this test circuitry are so-called primary inputs or outputs of the chip and are also known as chip pads. Since they are primary I/O pins, they can be directly controlled by an external chip tester which provides the control signals already listed above, as well as the A Clock, B Clock, Scan In and Scan Out signals for the LSSD latches as indicated in FIG. 2. Also, since a particular chip, such as a microprocessor, may already contain normal system elements which are capable of performing the functions of the test circuitry, the chip designer may use these existing system elements to perform the functions of the various registers, gates, counters, etc. required for testing the buried array. In this case, all that is required is an additional array Test Mode pin to allow the system primary I/O pins to be used for both normal I/O signals in normal operation of the chip, as well as for the above test mode functions, whereby the test signals are logically switched off when the array Test Mode pin is in the normal operation mode; thus, the only additional I/O overhead for the practice of this invention would be a single array Test Mode pin.

For a better understanding of the invention, there will now be described in detail one test of the memory array 10. This test will consist of the following sequence: write a memory cell, read a memory cell, increment the address, then repeat the foregoing steps until all addresses have completed the read-write operation in a ripple bit mode.

To initialize or load the system, the initial data and addresses are clocked into Registers A and B and Registers 1 and 2, respectively, by the use of the LSSD Scan chain using the signals Clock A, Clock B, and Scan In. Register A is loaded with all 1's, Register B with all 0's, and Registers 1 and 2 each with a starting address of 0. Then, the external tester puts the array Test Mode pin into the Test Mode and begins applying AC test patterns to the array. The array is first written to a known state, all 0's. To do this, the tester gates Register B to the Data Inputs of array 10 by switching Register Select to the B Register state, switches the array to address O by switching the Address Gate to the Ripple Bit Address mode via the Ripple Word/Bit Address I/O pin, and selects Register 1 by the Select Register 1/2 I/O pin; the tester then writes the array by switching the array into the Write mode, via the Read/Write R/W pin, and then back to the Read mode. As a result of these operations, a O is written into address O of the array.

Next, the address is incremented by placing the increment/decrement I/O pin in the Increment mode, the Select Register 1/2 I/O pin into the Register 1 mode, and by strobing Clock 1. As a result, the 0 in Register 1 is incremented by 1 to 1 and loaded back into Register 1. Then, the Write line is again activated so that a 0 is written into the array 10 at address 1. This process is repeated until the entire array is written to 0's.

The test is continued by writing the opposite data into the array so that 1's are written over the field of 0's. This operation is accomplished by switching Register Select to Register A for each Write cycle and back to Register B for each Read cycle.

This sequence is followed so that a 1 is written into the array during the Write cycle and a 0 is put on the Data Input of the array during the Read cycle. This procedure checks to determine that, when a 1 is to be read from the array, the cell does not merely follow what is ever on the Data Input (a 0 in this case, but, rather, has a 1 in it). Thus, this procedure tests not only for cell function, but also tests the Write-through condition just described. For continuation of the test, the contents of Register 1 are back at 0 since it has counted through the entire array and wrapped back to address 0. The Address Gate controls are left in the same state as the load pass, and so are the Adder controls. The Register Select pin is put in the Register A mode, the array is written by the Read/Write control, and the Register Select is put back to the Register B mode, and Clock 3 is then strobed to sample the output of the array during this read cycle. The contents of the Clock Register 20 are compared in the Compare logic 26 with the Data Inputs to assure that the contents are exactly out of phase with the Data Inputs. In the array data in the Clocked Register 20 compares exactly with the expected data out (the complement of the data input), then the Compare tree 26 provides to the external tester via the Compare I/O pin a signal indicating a pass or go condition. Next, the address is incremented in the same manner as previously described in the initialization or load pass, and the entire process is repeated until the array has been tested at all of the addresses. The sequence is repeated once more by writing only 0's over the fields of 1's to completely test the array 10.

Thus, it can be seen from the above operation of the circuit that the particular test performed on the embedded array in the chip is defined from the chip primary I/O pins which are under control of the external chip tester. Therefore, if it is desired to add a test, then the tester merely constructs a new test inside the chip without changing any chip logic. There are a large number of different options that this architecture allows the tester in constructing patterns inside the chip. Some of these options will now be described.

The Input Data test patterns are defined by the contents of Register A and Register B and by the manner in which the Register Select I/O pin selects the two registers. Since both registers are loaded through the LSSD latch string, any desired pattern can be shifted into these registers. Common patterns that may be loaded include all 1's, all 0's, and checkerboards. By operation of the Register Select control, one can convert the checkerboard pattern into a columnar bar by never writing the complement checkerboard pattern, and taking the pattern from only one register. Similarly, one could write alternate all 1's, all 0's into the array and produce row bars. Since the Register Select is a primary I/O pin, any combination of Register A and Register B contents can be written into the array in a test pass.

The Read/Write control, being a primary I/O, allows the array to be operated in any desired combination of Read/Write cycles, combinations, and desired lengths.

The use of two address registers provides a great deal of flexibility in the generation of address patterns. For example, they permit testing at two different addresses in the embedded array 10. Thus, there is the option of a socalled home/alternate type of testing which allows the address to change back and forth between two addresses in the array. Such a back and forth feature is very important in finding disturb conditions. Additionally, the word/bit feature allows the array to be tested in a physical manner by walking the test along a bit line or along a word line in the array. The increment/decrement feature allows the tester to go along a bit or word line in either direction. The types of patterns that are allowed are Ripple Word, Ripple Bit, Increment, Decrement, Home/Alternate, and Home Only.

Since each of the array input types is on a distinctly different and independent test pattern generation system, any combination of different data, address and read/write cycles and types might be chosen, each being totally independent of the other. Thus, it is possible to generate many different types of tests, such as write a checkerboard, write-read-read, and ripple bit home/alternate mode.

Figure 4:
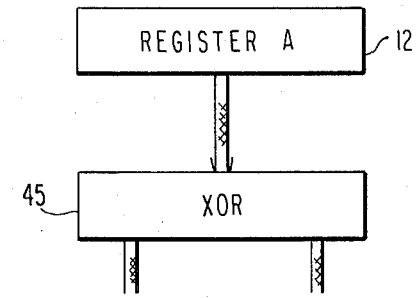

While in FIG. 1, the data generation means is implemented by the use of two registers 12 and 14 and a gate 22, it may also be implemented by a single register 12 whose outputs are fed through an exclusive OR gate 45. As shown in FIG. 4, the contents of the registers may then be inverted or complemented by applying an Invert signal to the gate 45.

Figure 5:
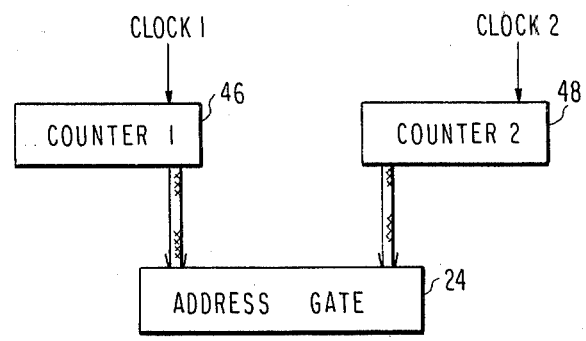
Figure 6:
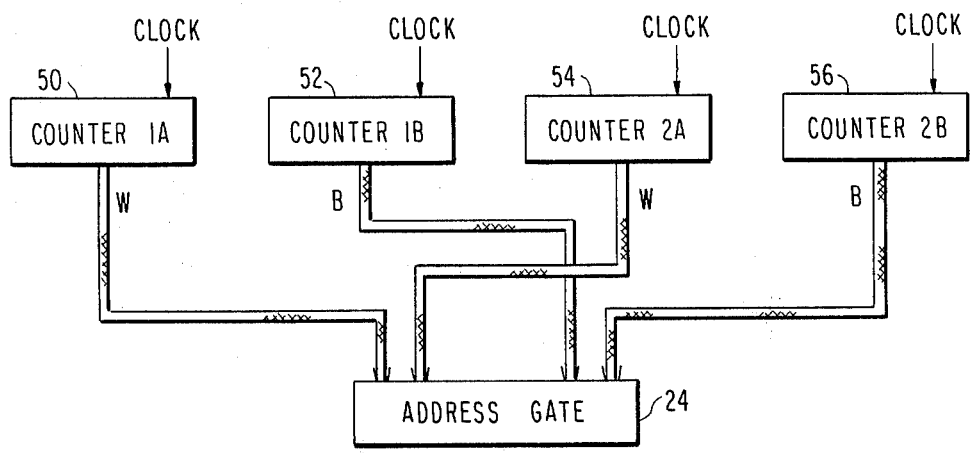

In FIG. 1, the incrementing address counter means is implemented by two registers 16 and 18 and an Increment/Decrement Adder 28. However, the incrementing counter address means may also be implemented by two up/down 8-bit counters 46 and 48 as shown in FIG. 5, or by two pairs of 5-bit and 3-bit counters 50, 52, 54 and 56 as illustrated in FIG. 6.

Another important feature of this invention is its capability of measuring AC performance. Since the signals applies to the array Data Inputs, Read/Write, and Addresses are determined by the primary I/O pins, the exact time the signal arrives at the chip can be determined by the placement of the signals to these pads. The performance of the chip is determined by the placement of these signals in reference to the strobe timing of Clock 3. Thus, any combination of input data timings, Read/Write timings, Address timings, and strobe timings may be selected by controlling the appropriate timing to the chip pads from the external tester, thereby allowing testing of the AC performance of the embedded array.

Any conventional programmable chip tester may be used to generate the control signals for initializing the registers and for conducting a particular test on the embedded array. One such tester is Model No. Sentry VIII or VII manufactured by Fairchild Test Systems.

Thus, there has been described an integrated circuit chip to which there has been added a minimum of additional chip architecture in the form of additional circuits and input/output pins to permit high speed testing of the embedded array while the array remains embedded. Furthermore, the array tests may be changed at will merely by reprogramming the external tester.

I claim:

1. In an integrated circuit chip of the type having an embedded memory array surrounded by circuit components, and a plurality of primary input/output pins, said array not being directly accessible from said pins, said array having data inputs and address inputs, said address inputs comprising word lines and bit lines, the improvement comprising the following array-testing chip means which permit complete testing of the array while the array is embedded:

data register means on the chip for supplying test data patterns via the data inputs to be written in selected array cells as selected by addresses on said address inputs;

incrementing address counter means on the chip for providing sequential addresses of the cells in said array;

ripple gate means on the chip for rippling the bit and word addresses applied to said address inputs, said ripple gate means being coupled between said address counter means and said address inputs; and comparison means on the chip for comparing data read out of the array with expected results and for generating a signal indicative of the comparison on one of said primary input/output pins.

2. The improvement of claim 1 wherein said data register means comprises first and second data registers, and data gate means for selectively gating either data register to said data inputs.

3. The improvement of claim 1 wherein said data register means comprises a data register, and gate means for selectively inverting the data register contents supplied to said data inputs.

4. The improvement of claims 1, 2 or 3 wherein said address counter means comprises first and second address registers, adder means for selectively incrementing the addresses in said address registers, and means for selecting either of said address registers to provide the sequential addresses to said ripple gate means.

5. The improvement of claim 4 wherein said ripple gate means is responsive to a Ripple Bit Address control signal to apply the low order, fast-moving bits of the provided address to the array address bit lines and the high order, slow-moving bits to the array word address lines, and responsive to a Ripple Word Address control signal to apply the high and low order bits oppositely to said bit and word address lines, respectively.

6. The improvement of claims 1, 2 or 3 wherein said address counter means comprises first and second up-/down counters, and means for selecting either of said counters to provide the sequential addresses to said ripple gate means.

7. The improvement of claims 1, 2 or 3 wherein said address counter means comprises two pairs of up/down counters, one counter of each pair containing a word address, and the other counter each pair containing a bit address, and means for selecting either pair to provide the sequential addresses to said ripple gate means.

8. In a method of fabricating an integrated circuit chip having a plurality of input/output pins and an embedded array surrounded by circuit components such that the array is not directly accessible from the input/output pins, said array having data inputs and address inputs, and said address inputs comprising word lines and bit lines, the improvement which permits complete testing of the array while it remains embedded, and comprising the steps of adding to the chip in any order the following testing components, which are accessible from primary input/output pins to which test signals are applied from an external tester:

data register means for supplying test data patterns via the data inputs to be written in selected array cells as selected by addresses on the address inputs;

incrementing address counter means for providing sequential addresses of the cells in the array;

ripple gate means for rippling the bit and word addresses applied to the address inputs, said ripple gate means being coupled between said address counter means and said address inputs; and comparison means for comparing data read out of the array with expected results and for generating a signal indicative of the comparison on one of the primary input/output pins.

9. The improvement of claim 8 wherein said expected results are derived from the data register means.

10. The improvement of claim 8 wherein said primary input/output pins are dedicated to said circuit components surrounding the embedded array, and further comprising the step of adding to the chip additional input/output pins which provide access to the added testing components by the test signals from the external tester.

* * * * *